United States Patent
Meissner et al.

(10) Patent No.: US 6,232,547 B1
(45) Date of Patent: May 15, 2001

(54) PHOTO CELL AND METHOD OF MANUFACTURING SUCH CELL BY CO-VALENT GROWTH OF A PHASE THEREON

(75) Inventors: Dieter Meissner, Linz (AT); Klaus Kohrs, Schweinitz (DE)

(73) Assignee: Forschungszentrum Jülich GmbH, Jülich (DE)

( * ) Notice: Subject to any disclaimer, the term of this patent is extended or adjusted under 35 U.S.C. 154(b) by 0 days.

(21) Appl. No.: 09/531,318

(22) Filed: Mar. 20, 2000

(30) Foreign Application Priority Data

Apr. 20, 2000 (DE) .............................. 199 15 223

(51) Int. Cl.⁷ .................................... H01L 31/04
(52) U.S. Cl. .................. 136/263; 136/252; 136/255; 136/256; 257/40; 257/431; 257/465; 429/111; 438/82; 438/85; 438/93; 438/98; 438/99
(58) Field of Search .................. 136/263, 252, 136/255, 256; 257/40, 431, 465; 429/111; 438/82, 85, 93, 98, 99

(56) References Cited

U.S. PATENT DOCUMENTS 4,839,112 * 6/1989 Wynne et al. ................... 264/435
5,176,786 * 1/1993 Debe ................................ 117/105
5,437,929 * 8/1995 Kenney et al. ................... 428/411.1
5,695,890 * 12/1997 Thompson et al. ................ 429/111

FOREIGN PATENT DOCUMENTS

2340658 * 2/2000 (GB) .

OTHER PUBLICATIONS

Desilvestro et al, J. Am. Chem. Soc., vol. 107, pp. 2988–2990, (1985).*
O'Regan et al, Nature, vol. 353, pp. 737–740, Oct. 1991.*
Sariciftci et al., Synthetic Metals, vol. 70, pp. 1349–1352 (1995).*

* cited by examiner

Primary Examiner—Alan Diamond
(74) Attorney, Agent, or Firm—Klaus J. Bach

(57) ABSTRACT

In a method of manufacturing a solar cell, a phase A is deposited in the form of stacks on an electrically conductive substrate, wherein the stacks are covalently and electrically interconnected and also connected to the substrate, and any spaces between the stacks are filled with a phase B, which is electrically connected to a counter electrode, wherein the phases A and B are so selected that they form a photovoltaic active transition structure or an injection contact. The invention also resides in a solar cell made in accordance with this method.

5 Claims, No Drawings

PHOTO CELL AND METHOD OF MANUFACTURING SUCH CELL BY CO-VALENT GROWTH OF A PHASE THEREON

BACKGROUND OF THE INVENTION

The invention resides in a photocell (solar cell). In a photocell or, respectively, solar cell, a charge carrier pair is generated by light. The charge carriers are conducted away separately. In this way, an electric current is produced.

So called Grätzel cells are known (B. O'Regan, M. Grätzel, Nature 353 (1991), 737), wherein a coloring substance layer is deposited on porous titanium oxide, which acts as an electrode. The coloring substance layer is in contact with a counter electrode by way of an electrolyte solution. The titanium oxide serves as carrier for the coloring substance and as semi-conductor electrode by way of which electrons transferred by light radiation from the coloring substance to the titanium oxide are carried away. The electric circuit is closed by way of the counter electrode and the electrolyte solution and the coloring substance, which is oxidized during the electron transfer, is again reduced.

Instead of by an electrolyte solution, the coloring substance can be contacted also by way of conductive polymers. However, then the efficiency is lower. It is only 3% as compared to 10.5% with wet-chemical cells.

It is disadvantageous that the coloring substance layer is unevenly distributed on the porous titanium dioxide. In areas where the layer is too thin, the light is not sufficiently absorbed. In areas where the layer is too thick, the absorbed light cannot be fully utilized for the generation of charge carrier pairs. Also, in many applications, the contacting of the coloring substance by a liquid electrolyte is disadvantageous.

In addition to the Grätzel solar cells, other solar cells are known, which include so-called interpenetrating networks of organic compounds (N. S. Sacriciftci, A. J. Heeger, Synthetic Metals 70 (1995), 1349). Such a network represents a kind of mixed phase of two contact materials in the solar cell.

It is further known to make, in a solar cell of the type referred to above, a first material particularly rough (J. Desilvestro, M. Grätzel, L. Kavon, J. Moser, J. Am. Chem. Soc. 107 (1985), 2988). A sufficient roughness is obtained for an organic semi-conductor by a suitable deposition procedure. The desired roughness can also be obtained by etching of organic semiconductors.

In the mixed phase, there is a phase A and a phase B. Phase A and phase B form either a photo-voltaic active transition (where a photo voltage and a photo current are generated by exposure to light) or a so-called injection contact. An injection contact is a contact between an excitable molecule or an excitable material and a semi-conductor. Upon excitation of a molecule, or respectively, the material, a charge carrier of a charge carrier pair generated by light excitation moves from the molecule or, respectively, material to the semi-conductor. In the case of injection, another phase C interfaces with the phase B. The phase C is such that the other charge carrier of the charge carrier pair is carried away.

A phase C adjoining the phase B can also be provided in the case of the classic photovoltaic active transition. The phase C then assumes the same function as in the case of the injection. With a direct photovoltaic transition, it is however not necessary to provide a phase C.

In a solar cell, there is an ohmic transition between the phase A and an electrode (a so-called front contact). The same is true for the phase B, or respectively, the phase C with respect to a counter electrode.

It is the object of the present invention to provide a method for the manufacture of a solar cell, which is improved over those known in the art and to provide a solar cell made by the method according to the invention.

SUMMARY OF THE INVENTION

In a method of manufacturing a solar cell, wherein, on an electrically conductive substrate, a phase A is deposited in the form of stacks or chains which are covalently and electrically interconnected and connected to the substrate by providing covalent chemical bindings, and any spaces between the stacks are filled with a phase B, which is electrically connected to a counter electrode, the phases A and B being so selected that they form a photo-voltaic active transition structure or an injection contact. The invention also resides in a solar cell made in accordance with this method.

The covalent chemical bindings relate to the interconnection of the molecules of the phase A and the interconnection of the electrically conductive substrate and the phase A. There will then be spaces formed between the two stacks or respectively, two bindings or chains of the phase A, for subsequent purposes. Sufficiently large spaces can also easily be formed by a follow-up treatment. With suitably selected molecules, each phase A grows in stacks, if covalent interconnections are provided.

The substrate may be transparent in order to achieve the desired excitation by light passing through the substrate. The substrate consists, for example, of a transparent conductive oxide such as indium/tin-oxide (ITO) on a glass or plastic carrier.

As phase A, for example all disc-like molecules are suitable such as porphyrins or phthalocyanines, which, by suitable chemical modification carry chemical groups capable of reacting only in the stacking direction perpendicularly to the disc plane thereof. A good example herefor are the Si-$\mu$-oxophthalocyanin polymers or complexes.

The spaces formed by stack-or chain-like deposition are subsequently filled by the phase B and then, if needed, by the phase C. As phase B, for example titanium dioxide may be provided. Subsequently, a counter electrode is formed on the surface from which phase B or phase C is accessible, by electrode material deposition. The counter electrode is so selected that it forms an ohmic contact with the phase B, or respectively, the phase C.

If it is not possible to deposit a thin film of A on most of the substrate, the contact between the substrate and the adjoining phases is to be so selected, that it provides for an essentially ohmic contact with the phase A, which is not blocking and which forms with respect to the phase B a diode disposed in the blocking direction. Such blocking may be achieved also by slow charge carrier exchange kinetics.

As phases B and/or C, organic semiconductors such as perylenes or suitable conductive polymers can be used besides inorganic semi-conductors such as titanium-, zinc-, and tin oxide, or cadmium or zinc sulfide. The contact to be applied last must form an essentially ohmic contact to the phase B or respectively, C and it must be free of short circuits with respect to the phase A. It may also serve for the solar cell as a transparent front contact, through which the desired light exposures occur.

The solar cell made by the method of the invention includes a phase A in the form of a chain or a stack and has covalent bindings within itself and to the substrate contact.

With the method for the manufacture of the solar cell according to the invention, the desired conductivity between a substrate contact and the phase A is established in a very good way because of the small distance provided by covalent bindings. Contacting problems of the type mentioned earlier are avoided therefore. Furthermore, the needed porosity for the manufacture of the solar cell is provided. Although no liquid electrolyte is used, there are no major losses in efficiency. The absorption is determined by the lengths of the stacks. Since the phase B is disposed between the stacks of phase A, no losses occur by the filter effect of excessively thick coloring material layers. It is possible in this way to ensure sufficient absorption without losses with respect to the electron transport.

Altogether, a solar cell with a good efficiency is the result.

DESCRIPTION OF A PREFERRED EMBODIMENT

Stack-like phthalocyanine polymers or complexes are so deposited on a conductive transparent substrate (for example, ITO glass) that the stack axis is disposed perpendicularly to the substrate. First, a dense layer of such stacks with a length of 5–10 nm is deposited in order to isolate the ITO glass against the $TiO_2$. Then stacks with a length which provides for sufficient light absorption are so set up that sufficiently large spaces are formed between the stacks. Into these spaces, titanium oxide is so introduced that it encloses the stacks also from the backside. The phthalocyanine stacks act as sensibilization coloring substance and, at the same time, assume the conductivity function of the electrolyte. The absorption is determined by the stack length. Since the titanium oxide is disposed between the phthalocyamine stacks, no losses can occur by the filtering effects of coloring substance layers, which are excessively thick.

The ITO glass is first treated with $SiCl_4$ and then dipped into a solution of metal-free soluble phthalocyanine. As a result, a layer of silicon-phthalocyanine (SiPc), which is connected covalently by oxygen bridges with the silicon-modified ITO, is obtained. At the topside, each Si-central atom of the SiPc has a Cl attached thereto. On top of this layer, a solution of short-chain Si-$\mu$-oxo-Pc's are applied (The solubility is achieved by substitution with alkyl-, alkoxy-, or thioether groups). Also, the OH- end groups of polymers can be converted by drop-wise delivery into an alcoholate solution to Na or K-salts in order to increase the reactivity. In this way, a dense layer of vertically oriented short polymer chains is obtained. Now, the long-chain polymer chains are attached to the short polymer chains with suitable spaces therebetween. For this purpose, the Pc-rings of the polymers may be provided, for example, with space filling substitutes which can be split-off. They are split off after the stacks are deposited and are then dissolved. The hollow spaces formed in this way are then filled with titanium dioxide. This can be achieved for example by filling titanium tetrachloride into the spaces followed by hydrolysis, by precipitation from sulfuric acid solution or by centrifuging of a colloidal solution of titanium tetrachloride.

What is claimed is:

1. A method of manufacturing a solar cell, comprising the steps of:

providing an electrically conductive planar substrate forming an electrode, depositing on said electrically conductive substrate a phase A in the form of stacks which are disposed essentially perpendicularly on said planar substrate and which are electrically interconnected and also connected to the substrate, filling any spaces between the stacks with a phase B, and connecting the phase B electrically with a counter electrode extending over said stacks in a plane opposite and parallel to said electrode, wherein the phases A and B are so selected that they form a photovoltaic active transition or an injection contact.

2. A method according to claim 1, wherein the stacks of phase A are co-valently bound.

3. A method according to claim 1, wherein a transparent substrate is used as the electrode.

4. A method according to claim 1, wherein the phase B is connected to the counter electrode by way of a phase C.

5. A solar cell with an electrically conductive substrate forming an electrode, comprising a phase A deposited in the form of stacks on said substrate, said stacks being disposed essentially perpendicularly on said substrate and being directly covalently bound thereto and forming spaces between said stacks of said phase A, a phase B disposed in the spaces between said stacks of the phase A, said phase B forming with the phase A a photovoltaic active transition or an injection contact and being connected to a counter electrode extending over said stacks in a plane opposite and parallel to said electrode.

* * * * *